United States Patent
Peake

(10) Patent No.: US 7,504,307 B2
(45) Date of Patent: Mar. 17, 2009

(54) SEMICONDUCTOR DEVICES INCLUDING VOLTAGE-SUSTAINING SPACE-CHARGE ZONE AND METHODS OF MANUFACTURE THEREOF

(75) Inventor: Steven T. Peake, Woolston (GB)

(73) Assignee: NXP B.V., Eindhoven (NL)

( * ) Notice: Subject to any disclaimer, the term of this patent is extended or adjusted under 35 U.S.C. 154(b) by 61 days.

(21) Appl. No.: 11/574,973

(22) PCT Filed: Sep. 6, 2005

(86) PCT No.: PCT/IB2005/052899

§ 371 (c)(1),
(2), (4) Date: Mar. 8, 2007

(87) PCT Pub. No.: WO2006/027739

PCT Pub. Date: Mar. 16, 2006

(65) Prior Publication Data

US 2008/0064166 A1 Mar. 13, 2008

(30) Foreign Application Priority Data

Sep. 8, 2004 (EP) .................................... 0419867

(51) Int. Cl.
*H01L 21/336* (2006.01)
(52) U.S. Cl. ................ 438/270; 257/E21.409
(58) Field of Classification Search ......... 257/327–341, 257/E21.409; 438/270
See application file for complete search history.

(56) References Cited

U.S. PATENT DOCUMENTS 6,534,828 B1 * 3/2003 Kocon ........................ 257/341

FOREIGN PATENT DOCUMENTS

EP 1359624 A2 * 11/2003

* cited by examiner

*Primary Examiner*—Matthew Smith
*Assistant Examiner*—Walter H Swanson
(74) *Attorney, Agent, or Firm*—Peter Zawilski

(57) ABSTRACT

There is a method of manufacturing a semi conductor device that comprises source and drain regions of a first conductivity type, and a channel-accommodating region of a second, opposite conductivity type which separates the source and drain regions. The device comprises a gate which extends adjacent to the channel-accommodating region. The method includes the steps of etching a trench into the semiconductor body of the device at a location laterally spaced from that of the gate; and implanting a second conductivity type dopant into the body through the bottom of the trench to form a second conductivity type localised region in the drain region. The dimensions and doping level of the localised level of the localised region in the finished device is such that the localised region and adjacent portions of the drain region provide a voltage-sustaining space-charge zone when depleted.

17 Claims, 3 Drawing Sheets

SEMICONDUCTOR DEVICES INCLUDING VOLTAGE-SUSTAINING SPACE-CHARGE ZONE AND METHODS OF MANUFACTURE THEREOF

The present invention relates to power semiconductor transistor devices and methods of manufacture of such devices. In particular, it is concerned with manufacturing such devices with an improved trade-off between on-resistance and breakdown voltage.

For many power device applications, a significant cause of power loss is conduction losses associated with the device on-state resistance. In particular, the on-resistance of a MOSFET does not merely increase linearly as the breakdown voltage of the device is increased, but as a power of 2.4.

United States patent specification U.S. Pat. No. 4,754,310 (Applicants' reference PHB32740) discloses semiconductor devices with depletable multiple-region (multiple RESURF) semiconductor material comprising alternating p-type and n-type regions, which together provide a voltage-sustaining space-charge zone when depleted. The use of such material for the space-charge zone permits the achievement of a lower on-resistance in a device having a given breakdown voltage than predicted by the relationship given above. This has been found to be particularly advantageous for high voltage MOSFET devices. The whole content of U.S. Pat. No. 4,754,310 are hereby incorporated herein as reference material.

Multiple RESURF structures have since been employed in low voltage MOSFET devices to significantly reduce their on-resistance. However, the fabrication of such structures has often been found to be costly and complex.

A paper entitled "Ultra-low on-resistance 60-100V superjunction UMOSFETs fabricated by multiple ion-implantation" (Ninomiya et al, Proceedings of 2004 International Symposium on Power Semiconductor Devices & ICs, pages 177-180) describes a low voltage trench MOSFET device in which p-type columns are formed in the n-type epitaxial layer by high energy boron ion implantations through mask windows. The implantation process was divided into multiple injections with different energies.

The present invention provides a method of manufacturing a semiconductor device including a semiconductor body, the semiconductor body comprising top and bottom major surfaces, source and drain regions of a first conductivity type, and a channel-accommodating region of a second, opposite conductivity type which separates the source and drain regions, the device further comprising a gate which extends adjacent to the channel-accommodating region, including the steps of:

(a) etching a trench into the top major surface of the body at a location laterally spaced from that of the gate; and (b) implanting a second conductivity type dopant into the body through the bottom of the trench to form a second conductivity type localised region in the drain region, the dimensions and doping level of the localised region in the finished device being such that the localised region and adjacent portions of the drain region provide a voltage-sustaining space-charge zone when depleted.

In the device described in the paper of Ninomiya, p-type regions are formed in the epitaxial layer by implantations into the top major surface of the semiconductor body. In contrast, according to the invention, a localised region of the second conductivity type is formed by implantation through the bottom of a trench, a distance from the top major surface. This enables the formation of the localised region at a significantly greater depth for a given implantation energy. Implantation of the localised region at a greater depth substantially reduces the amount of lateral diffusion caused by deflection of the implanted atoms by those of the semiconductor body. This gives closer control of the shape of the localised region, enabling the cell pitch of the device to be minimised, and the charge balance in the drift region to be improved.

The formation of a localised region with sidewalls extending substantially perpendicular to the top and bottom major surfaces of the semiconductor body (due to minimised lateral diffusion) also serves to minimise restriction of conduction through the drift region.

In a preferred embodiment, the drain drift region comprises a drain contact region and a drain drift region, with the drain drift region between the channel-accommodating region and the drain contact region, and the drain drift region is doped to a lesser extent than the drain contact region, wherein the localised region extends substantially across the drain drift region towards the drain contact region.

As noted above, the present method enables the formation of deeper second conductivity type localised regions. Deeper localised regions enable a greater forward voltage to be blocked.

Preferably, localised region in the finished device is elongate in a direction perpendicular to the top major surface of the semiconductor body.

In a preferred approach, a plurality of implantations of the second conductivity type dopant at different energies are employed to form the localised regions.

The parameters of the second conductivity type implantation are selected to form a localised region having a predetermined dopant concentration in the finished device. This concentration may be varied for a given drain drift region doping level to produce a device having a selected breakdown voltage in a given range.

Preferably, the doping profile of the localised region in the finished device in a direction perpendicular to the top major surface of the semiconductor body is substantially uniform. This serves to spread applied potential uniformly across the drain drift region, thereby achieving effective charge balance between n- and p-type regions.

In a preferred embodiment, the method of the invention includes the steps of:

(c) depositing a layer of insulating material over the sidewalls and bottom of the trench; and (d) depositing material in the trench over the insulating layer to provide an electrode therein.

More particularly, the method may include the steps of:

(e) providing a source electrode in contact with the source region; and (f) providing a connection between the trenched electrode and the source electrode of the device.

Connection of the trench electrode to the source electrode of the device serves to reduce the gate-source capacitance of the structure.

Embodiments of the invention will now be described by way of example and with reference to the accompanying schematic drawings, wherein.

Figure 1:
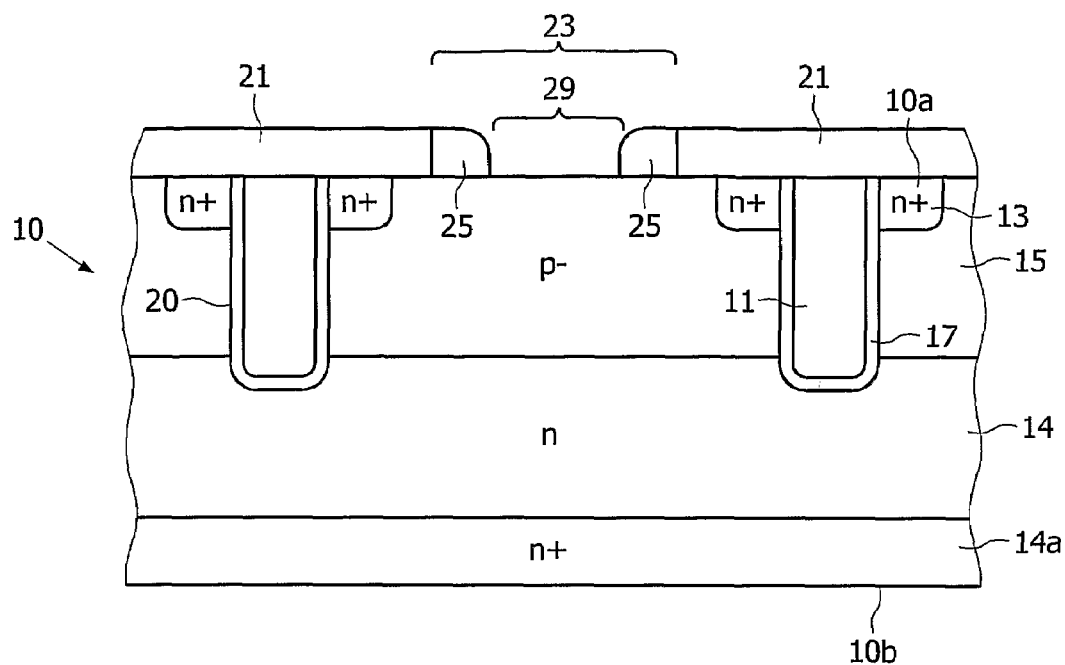
FIGS. 1-3 are cross-sectional views of transistor cell areas of a semiconductor body at successive stages in the manufacture of a trench-gate semiconductor device by one example of a method in accordance with the present invention.

It should be noted that FIGS. 1 to 4 are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

An exemplary embodiment of a process for fabricating a power semiconductor field effect transistor device according to the invention will now be described having regard to FIGS. 1-3.

FIG. 1 shows a semiconductor body 10. In the transistor cell areas of the device shown, source and drain regions 13 and 14, 14a respectively, of a first conductivity type (n-type in this example) are separated by a channel-accommodating body region 15 of the opposite, second conductivity type (that is p-type in this example).

The drain region comprises a low doped drain drift region 14 over a drain contact region 14a.

A gate 11 is present in a trench 20, which extends through the source and channel-accommodating regions 13 and 15 into the drift region 14. The gate is insulated from the semiconductor body by an insulating layer 17. The semiconductor body 10 has a top major surface 10a and a bottom major surface 10b.

After formation of the structures described above in the semiconductor body (which may be achieved in a well known manner), a layer of masking material, TEOS for example, is deposited on the top major surface 10a. This layer is then etched in a known manner to form a mask layer 21, which defines a window 23. A layer of a further masking material (which is selectively etchable relative to TEOS), silicon nitride for example, is then deposited and a spacer etch process carried out, to leave spacers 25 adjacent to the sidewalls of mask layer 21. Mask layer 21 in combination with spacers 25 defines a window 29. Window 23 may be typically about 1 micron wide. Using spacers 25 having a width of 0.25 micron trenchFET window 29 has a width of about 0.5 micron.

Figure 2:
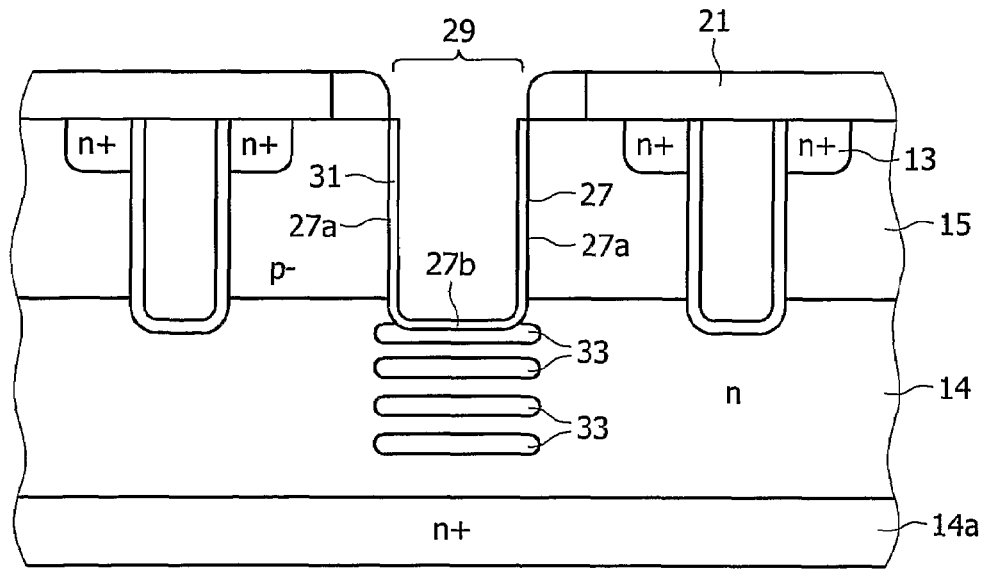

An anisotropic etch process is carried out to form a trench 27 at the window 29 midway between the adjacent trench gates 11, as shown in FIG. 2. This is followed by an oxidation process to form a thin oxide layer 31 over the sidewalls 27a and bottom 27b of the trench 27.

A series of implantations of p-type conductivity dopant, boron for example, are then performed at different energies, to form a plurality of p-regions 33, around and below the bottom 27b of the trench. Typically, the implantation energies may range between 320 keV and 2 MeV.

Electrode material, such as doped polycrystalline silicon, is now deposited in a known manner and then etched back, to leave the material only in the trench 27, to form an electrode 34 therein. An electrical connection between this electrode and the gate may be provided outside the cross-sectional plane of the figures. Preferably such a connection is provided between the electrode and the source electrode in the finished device.

Spacers 25 are then removed using a suitable etchant, selective between the spacer material and that of mask layer 21. A further shallow implantation of p-type dopant atoms is then carried out at mask window 23, to form p-type contact regions 35 adjacent to the top major surface of the semiconductor body, as shown in FIG. 3.

A heating treatment for annealing the implanted regions 33 and 35 is then carried out. As can be seen in FIG. 3, this also causes diffusion of regions 33 to form a single localised region 37.

Electrode material (for example aluminium) is now deposited to provide a source electrode 39 in contact with the portion of the semiconductor top major surface 10a exposed at window 23. As illustrated in FIG. 3, the source electrode 39 may also extend over the mask layer 21. Electrode material is also deposited over the bottom major surface 10b to form a drain electrode 41 in contact with the drain contact region 14a.

Figure 3:
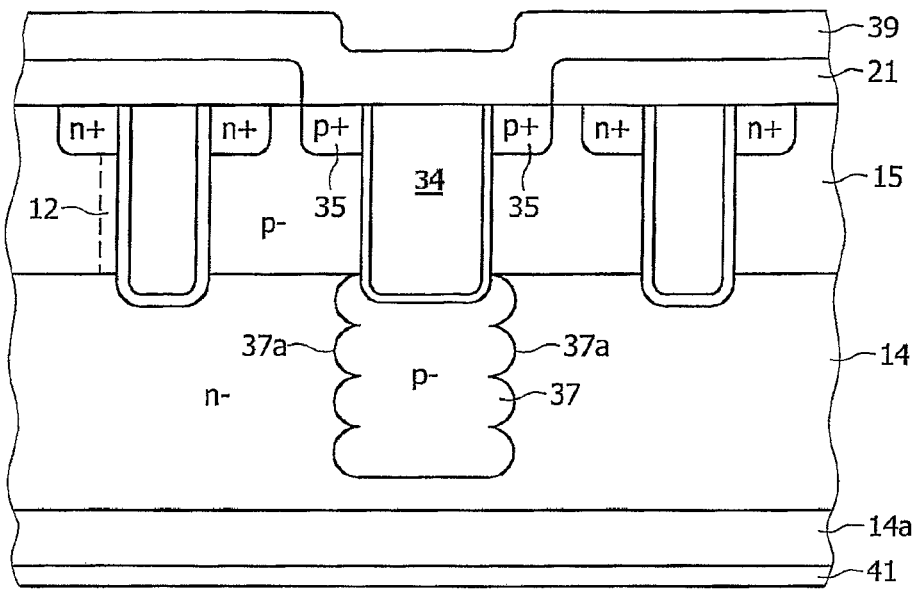

In the finished device configuration shown in FIG. 3, it can be seen that localised region 37 extends downwardly from the trench bottom 27b, substantially across the drain drift region 14 towards the drain contact region 14a. The localised region 37 has sidewalls 37a which define planes substantially perpendicular to the top and bottom major surfaces of the semiconductor body 10.

For example, in the structure of FIG. 3, the channel-accommodating region 15 may have a p-type dopant concentration of $1.4 \times 10^{17}$ atoms/cm$^3$, the drain drift region an n-type dopant concentration of $2 \times 10^{16}$ atoms/cm$^3$, and the localised region 37 a p-type dopant concentration in the range $3\text{-}6 \times 10^{16}$ atoms/cm$^3$.

In one example, the cell pitch between consecutive trenches 27 is 3 microns, and the drain drift region 14 is 6 microns deep. The localised region extends about 3 microns below the channel-accommodating region, the limiting factor being the extent of out-diffusion from the drain contact region 14a into the drain drift region 14. The localised region is about 1.5 microns wide in the finished device.

Preferably, the width of the localised region 37 is about half the cell pitch. In the preferred embodiment shown in FIG. 3, four implantations at different energies are carried out to form the localised region. The number of implantations required depends on the thickness of the drain drift region and the breakdown voltage desired.

Figure 5:
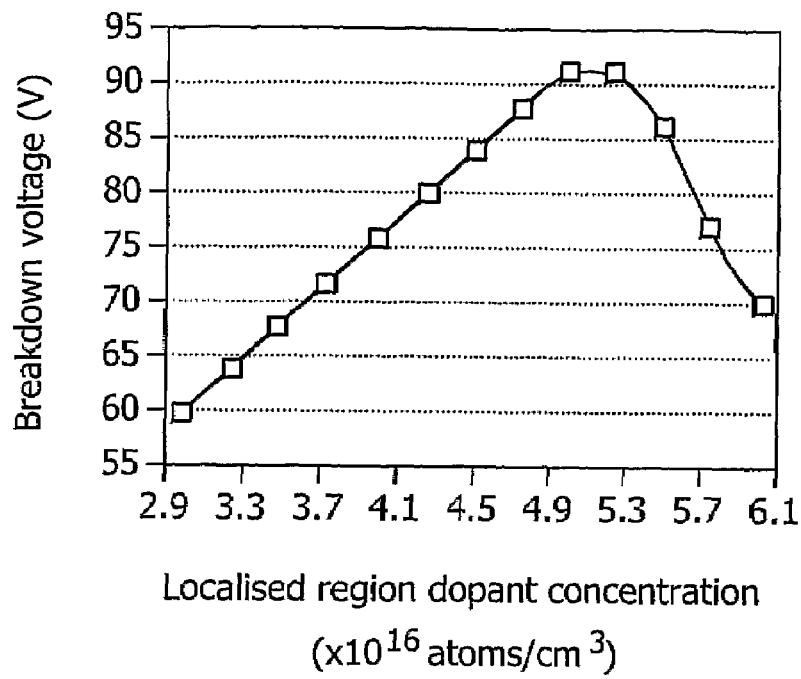
FIG. 5 is a graph showing a plot of breakdown voltage against second conductivity type dopant concentration in the localised region of the embodiment shown in FIG. 3.

Simulation of a device having the exemplary parameters described above produced the results shown in FIGS. 5 and 6. FIG. 5 shows the predicted breakdown voltage plotted as a function of the p-type dopant concentration in the localised region 37. It shows that the increase in breakdown voltage with dopant concentration in the localised region is linear up to a concentration of around $5.1 \times 10^{16}$ atoms/cm$^3$. Thus it can be seen that the breakdown voltage of the device can be predetermined by selecting a suitable p-type dopant concentration in the localised region, for a given drain drift region doping level.

In simulation, inclusion of localised regions 37 in a structure was found to increase its breakdown voltage from around 42 volts to around 93 volts.

Figure 6:
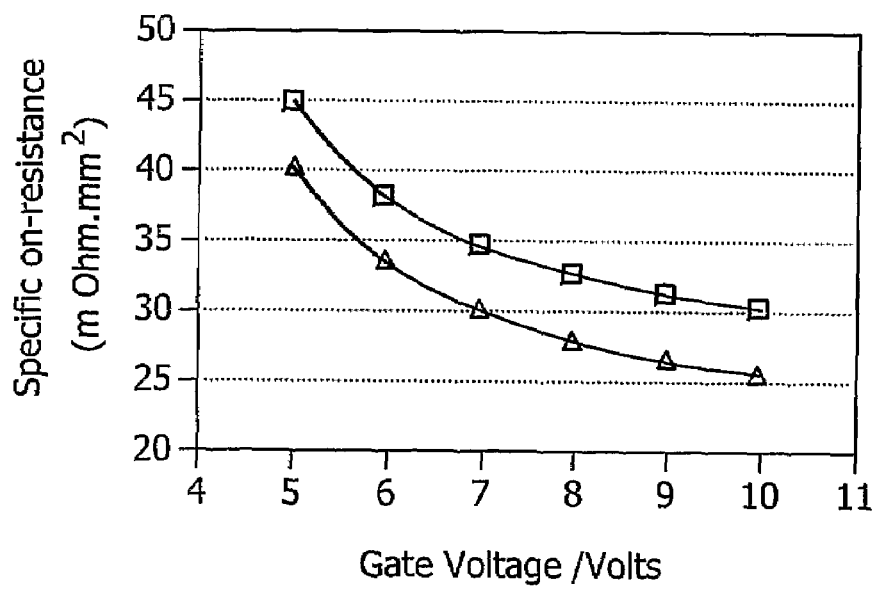
FIG. 6 is a graph showing plots of specific on-resistance against gate voltage for a conventional trench-gate device, and the embodiment shown in FIG. 3.

FIG. 6 shows the results of a simulation plotting specific on-resistance as a function of gate voltage for a conventional trench-gate structure, and for a structure of the form shown in FIG. 3. The results for the known structure are plotted using triangular data points, whilst those of the FIG. 3 structure (having a dopant concentration in the localised region 37 of $5 \times 10^{16}$ atoms/cm$^3$) are plotted using square data points. With a gate voltage of 10 volts, it can be seen that the specific on-resistance of the FIG. 3 structure is around 30 mOhms/mm$^2$ compared to 26 mOhms/mm$^2$ for the equivalent known structure. Both simulations include the resistance of a 150 micron thick drain contact layer. Thus there may only be a small increase in specific on-resistance for a substantial increase in breakdown voltage in a structure in accordance with the present invention.

Figure 4:
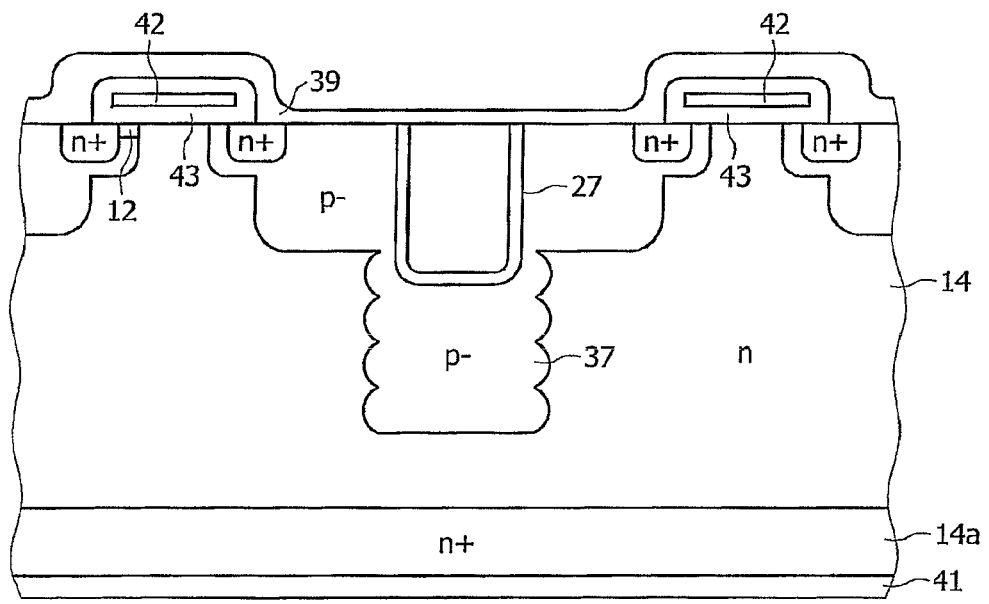
FIG. 4 is a cross-sectional view of transistor cell areas of a semiconductor body of a planar gate semiconductor device according to a second embodiment of the present invention.

FIG. 4 shows a further embodiment of the invention in which a localised region 37 is formed below a trench 27 in the manner described above in a planar gate, DMOS type device configuration. Planar gates 42 are provided over an insulating layer 43 on the top major surface 10a of the semiconductor body 10.

The particular examples described in relation to FIGS. 3 and 4 are n-channel devices, in which the regions 13, 14 and 14a are of n-type conductivity, the regions 15 and 37 are of p-type, and an electron inversion channel 12 is induced in the region 15 by the gates 11 and 42, respectively. By using opposite conductivity type dopants a p-channel device can be manufactured by a method in accordance with the invention. In this case, the regions 13, 14 and 14a are of p-type conductivity, the regions 15 and 37 are of n-type, and a hole inversion channel 12 is induced in the region 15 by the gates 11 and 42.

Vertical discrete devices have been illustrated with reference to FIGS. 3 and 4, having a second main electrode 41 contacting the region 14a at the back surface 10b of the body 10. However, an integrated device is also possible in accordance with the invention. In this case, the region 14a may be a doped buried layer between the drain contact region and the epitaxial layer-doped drain drift region 14. This buried layer region may be contacted by an electrode at the front major surface 10a, via a doped peripheral contact region which extends from the surface 10a to the depth of the buried layer.

No plan view of the cellular layout geometry is shown in the drawings, because the configurations and methods described herein may be used for quite different common known cell geometries. Thus, for example, the cells may have a square geometry, or they may have a close-packed hexagonal geometry, or an elongate stripe geometry. In each case, the gate (11 or 42) extends around the boundary of each cell. FIGS. 3 and 4 show only a few cells, but typically the device will comprise many hundreds of these parallel cells between the electrodes 39 and 41.

The active cellular area of the device may be bounded around the periphery of the body 10 by various known peripheral termination schemes (also not shown). Such schemes normally include the formation of a thick field-oxide layer at the peripheral area of the body surface 10a, before the transistor cell fabrication step. Furthermore, various known circuits (such as gate-control circuits) may be integrated with the device in an area of body 10, between the active cellular area and the peripheral termination scheme. Typically, these circuit elements may be fabricated with their own layout in this circuit area using some of the same masking and doping steps as are used for the transistor cells.

From reading the present disclosure, other variations and modifications will be apparent to persons skilled in the art. Such variations and modifications may involve equivalent and other features which are already known in the art, and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

The invention claimed is:

1. A method of manufacturing a semiconductor device including a semiconductor body, the semiconductor body comprising top and bottom major surfaces, source and drain regions of a first conductivity type, and a channel-accommodating region of a second, opposite conductivity type which separates the source and drain regions, the device further comprising a gate which extends adjacent to the channel-accommodating region, including the steps of:
   (a) etching a trench into the top major surface of the body at a location laterally spaced from that of the gate; and
   (b) implanting a second conductivity type dopant into the body through the bottom of the trench to form a second conductivity type localised region in the drain region, the dimensions and doping level of the localised region in the finished device being such that the localised region and adjacent portions of the drain region provide a voltage-sustaining space-charge zone when depleted.

2. The method of claim 1 wherein the drain region comprises a drain contact region and a drain drift region, with the drain drift region between the channel-accommodating region and the drain contact region, and the drain drift region is doped to a lesser extent than the drain contact region, wherein the localised region extends substantially across the drain drift region towards the drain contact region.

3. The method of claim 2 wherein the gate is either a trench gate or planar gate.

4. The method of claim 1 wherein the localised region in the finished device is elongated in a direction perpendicular to the top major surface of the semiconductor body.

5. The method of claim 4 wherein the gate is either a trench gate or planar gate.

6. The method of claim 1 wherein step (b) comprises a plurality of implantations of the second conductivity type dopant at different energies.

7. The method of claim 6 wherein the gate is either a trench gate or planar gate.

8. The method of claim 6, wherein the plurality of implantations are performed at four different energies.

9. The method of claim 1 wherein the doping profile of the localised region in the finished device in a direction perpendicular to the top major surface of the semiconductor body is substantially uniform.

10. The method of claim 9 wherein the gate is either a trench gate or planar gate.

11. The method of claim 1 further including the steps of:
   (c) depositing a layer of insulating material over the sidewalls and bottom of the trench; and
   (d) depositing material in the trench over the insulating layer to provide an electrode therein.

12. The method of claim 11 further including the steps of:
   (e) providing a source electrode in contact with the source region; and
   (f) providing a connection between the electrode deposited in the trench and the source electrode of the device.

13. The method of claim 12 wherein the gate is either a trench gate or planar gate.

14. The method of claim 11 wherein the gate is either a trench gate or planar gate.

15. The method of claim 1 wherein the gate is a trench-gate.

16. The method of claim 1 wherein the gate is a planar gate.

17. A semiconductor device manufactured by the method of claim 1.

* * * * *